(12) United States Patent
Naohara et al.

(10) Patent No.: US 10,506,724 B2
(45) Date of Patent: *Dec. 10, 2019

(54) ELECTRONIC CIRCUIT BOARD

(71) Applicant: Yazaki Corporation, Tokyo (JP)

(72) Inventors: Masayuki Naohara, Shizuoka (JP);
Tomohiro Sugiura, Shizuoka (JP);
Yoshihiro Kawamura, Shizuoka (JP)

(73) Assignee: YAZAKI CORPORATION,
Minato-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/166,765

(22) Filed: Oct. 22, 2018

(65) Prior Publication Data
US 2019/0150299 A1 May 16, 2019

(30) Foreign Application Priority Data

Nov. 16, 2017 (JP) .................................. 2017-220794

(51) Int. Cl.
H02G 3/16 (2006.01)
H05K 3/46 (2006.01)
H05K 7/14 (2006.01)
H05K 1/14 (2006.01)
H05K 1/03 (2006.01)
H05K 1/09 (2006.01)
H05K 3/02 (2006.01)

(52) U.S. Cl.
CPC ............. H05K 3/4691 (2013.01); H02G 3/16 (2013.01); H05K 1/0393 (2013.01); H05K 1/09 (2013.01); H05K 1/141 (2013.01); H05K 3/022 (2013.01); H05K 7/14 (2013.01); H05K 2201/0355 (2013.01); H05K 2201/058 (2013.01)

(58) Field of Classification Search
USPC ......................................... 361/749
See application file for complete search history.

(56) References Cited

U.S. PATENT DOCUMENTS 6,396,709 B1    5/2002  Schmich
2011/0132643 A1*  6/2011  Hattori ..................... C22F 1/08
                                                            174/254

(Continued)

FOREIGN PATENT DOCUMENTS

JP    58-166085 U    11/1983
JP    3-227096 A    10/1991
JP    5-335696 A    12/1993

(Continued)

Primary Examiner — Andargie M Aychillhum
(74) Attorney, Agent, or Firm — Sughrue Mion, PLLC

(57) ABSTRACT

An electronic circuit board includes a plurality of hard rigid board portions each of which has an insulating insulator and a conductive circuit pattern and electrically connects a mounted electronic component to the circuit pattern; and at least one soft flexible board portion which has an insulating insulator, has a conductive circuit pattern electrically connected to each of the circuit patterns of at least two rigid board portions among the plurality of rigid board portions, and is integrated with the rigid board portions which are electrically connected to the circuit pattern of the flexible board portion. The insulator of the flexible board portion is provided with a through-hole at a place where the circuit pattern of the flexible board portion is not stacked.

8 Claims, 9 Drawing Sheets

(56) References Cited

U.S. PATENT DOCUMENTS

2015/0062834 A1* 3/2015 Kitajo .................... H05K 1/111
　　　　　　　　　　　　　　　　　　　　　　　361/736
2015/0282338 A1* 10/2015 Lu ......................... E05B 19/00
　　　　　　　　　　　　　　　　　　　　　　　361/752

FOREIGN PATENT DOCUMENTS

| JP | 2000-294885 A | 10/2000 |
| JP | 2017-22183 A | 1/2017 |
| JP | 2017-022184 A | 1/2017 |
| JP | 2017-022809 A | 1/2017 |

* cited by examiner

ELECTRONIC CIRCUIT BOARD

CROSS-REFERENCE TO RELATED APPLICATION(S)

The present application claims priority to and incorporates by reference the entire contents of Japanese Patent Application No. 2017-220794 filed in Japan on Nov. 16, 2017.

BACKGROUND OF THE INVENTION

1. Field of the Invention

The present invention relates to an electronic circuit board.

2. Description of the Related Art

Conventionally, as an electronic circuit board, one in which a hard rigid board portion and a soft flexible board portion are integrated is known. In the rigid board portion, a rigid insulator and a circuit pattern are arranged in layers. In addition, a soft insulator and a circuit pattern are arranged in layers in the flexible board portion. Such a type of electronic circuit board is disclosed, for example, in the following Japanese Patent Application Laid-open No. 2017-22184 and Japanese Patent Application Laid-open No. 2017-22809. The electronic circuit boards described in Japanese Patent Application Laid-open No. 2017-22184 and Japanese Patent Application Laid-open No. 2017-22809 have two rigid board portions and a flexible board portion arranged therebetween, and a portion between the two rigid board portions is bent via the flexible board portion.

Meanwhile, circuit patterns of the two rigid board portions are electrically connected to each other via a circuit pattern of the flexible board portion in the conventional electronic circuit boards. Therefore, a soft conductor having flexibility is used for the circuit pattern in the flexible board portion, and the flexibility increases as a ratio of the circuit pattern to the total area as viewed in a stacking direction increases. However, a circuit pattern in which a plurality of conductive portions is stretched is formed in the electronic circuit board, and the conductive portions are arranged with a distance (creepage distance) therebetween in order to secure an insulating property between the conductive portions. Accordingly, it is difficult to enhance the flexibility of the flexible board portion because the ratio of the circuit pattern to the total area as viewed in the stacking direction decreases as the distance between the conductive portions of the circuit pattern needs to be set to be large.

SUMMARY OF THE INVENTION

Therefore, a purpose of the present invention is to provide an electronic circuit board capable of enhancing flexibility of a flexible board portion.

According to an aspect of the present invention, an electronic circuit board includes: a plurality of hard rigid board portions each of which has an insulating insulator and a conductive circuit pattern and electrically connects a mounted electronic component to the circuit pattern; and at least one soft flexible board portion which has an insulating insulator, has a conductive circuit pattern electrically connected to each of the circuit patterns of at least two rigid board portions among the plurality of rigid board portions, and is integrated with the rigid board portions which are electrically connected to the circuit pattern of the flexible board portion. The insulator of the flexible board portion is provided with a through-hole at a place where the circuit pattern of the flexible board portion is not stacked.

According to another aspect of the present invention, in the electronic circuit board, the rigid board portion and the flexible board portion may be formed based on a circuit board intermediate body including an insulating base material on which a hard insulating layer and a soft insulating layer are stacked and a soft conductive base material provided on the insulating base material, the flexible board portion may be formed using a remaining portion cut from the circuit board intermediate body to leave a soft insulating layer and the conductive base material provided on the soft insulating layer to form the flexible board portion, the insulator of the rigid board portion may be formed using the hard insulating layer and the soft insulating layer, the circuit pattern of each of the rigid board portion and the flexible board portion may be formed using the conductive base material, and the insulator of the flexible board portion may be formed using the soft insulating layer.

According to still another aspect of the present invention, in the electronic circuit board, the circuit pattern of the flexible board portion may be formed using a rolled copper foil.

According to still another aspect of the present invention, in the electronic circuit board, when the rigid board portion and the flexible board portion are accommodated in an accommodation chamber such that the through-hole faces an opening of the accommodation chamber of an accommodation box, the through-hole may be used as an injection port of a filler with which the accommodation chamber is filled.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
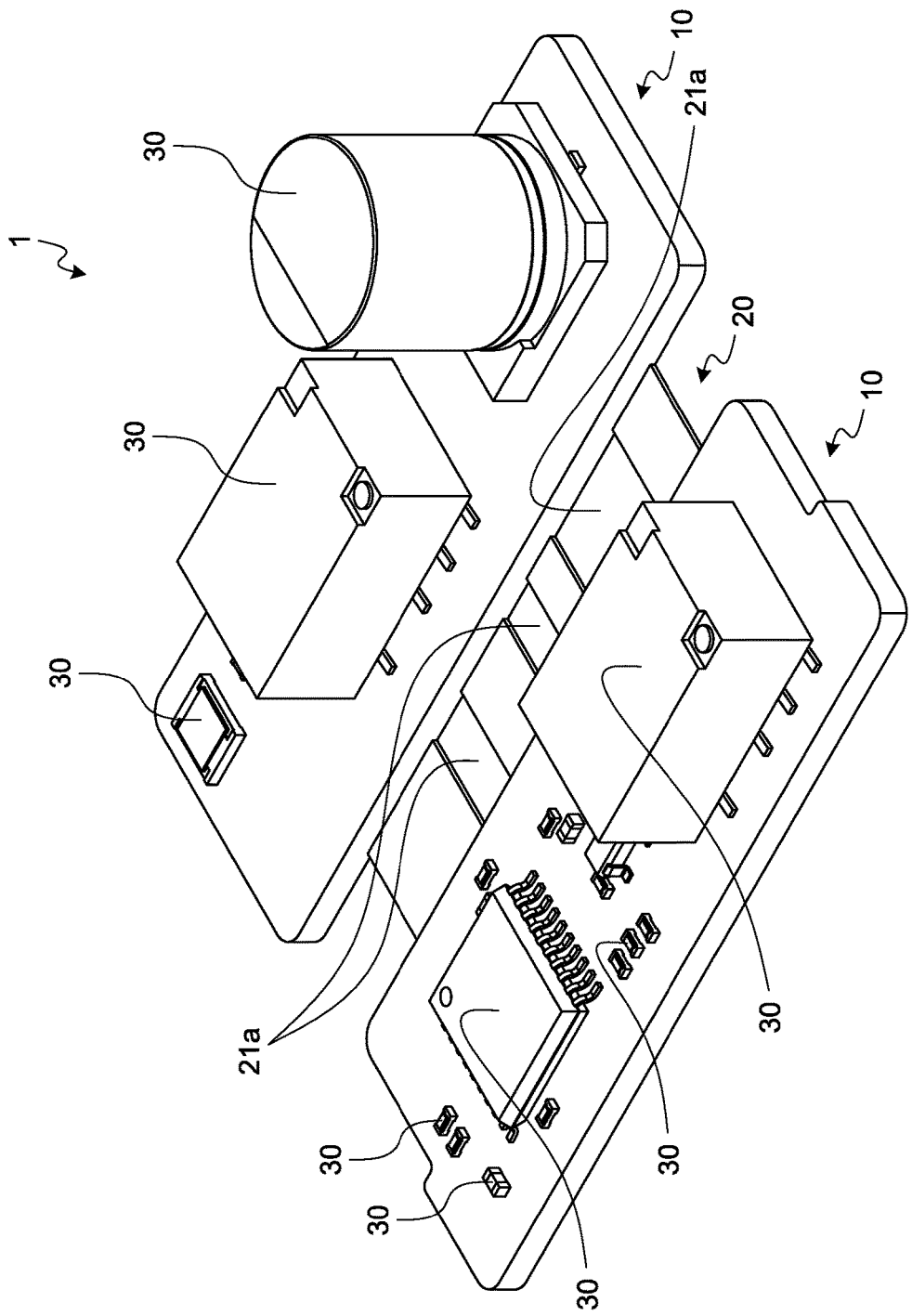
FIG. 1 is a perspective view illustrating an electronic circuit board of an embodiment.
Figure 2:
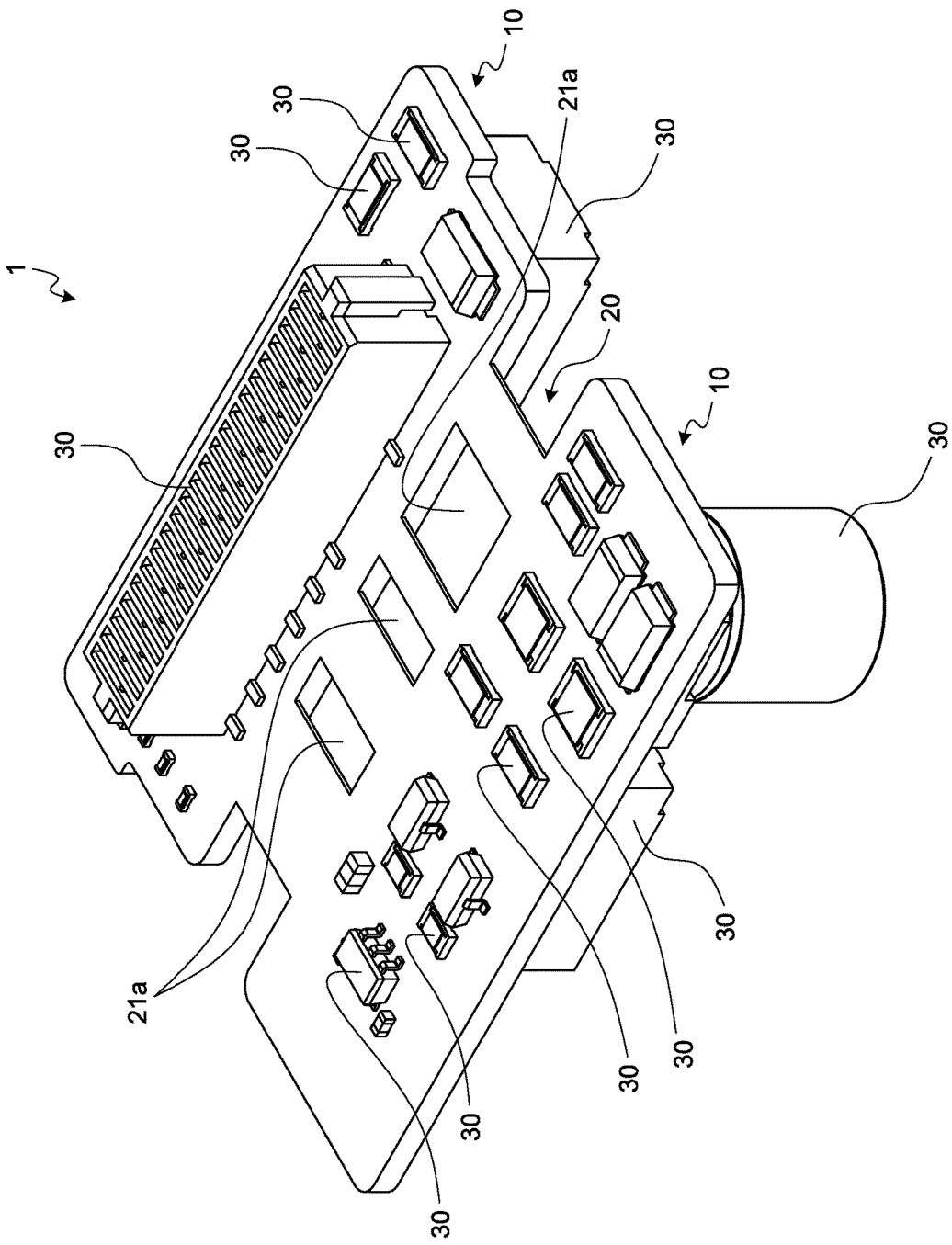
FIG. 2 is a perspective view of the electronic circuit board of the embodiment viewed from another angle.

Hereinafter, embodiments of an electronic circuit board according to the present invention will be described in detail with reference to the drawings. Incidentally, the invention is not limited by the embodiment.

Embodiment

One of the embodiments of the electronic circuit board according to the present invention will be described with reference to FIGS. 1 to 9.

Reference numeral 1 in FIGS. 1 to 4 represents an electronic circuit board according to the present embodiment. The electronic circuit board 1 illustrated herein is an example of a so-called printed wiring board (PWB) before electronic components 30 are mounted. However, the present embodiment does not exclude a so-called printed circuit board (PCB) on which the electronic components 30 are mounted.

The electronic circuit board 1 includes a plurality of hard rigid board portions 10, and at least one soft flexible board portion 20 (FIGS. 1 to 4). The electronic components 30 to be mounted are mounted on the electronic circuit board 1 (FIGS. 1 to 4).

Figure 4:
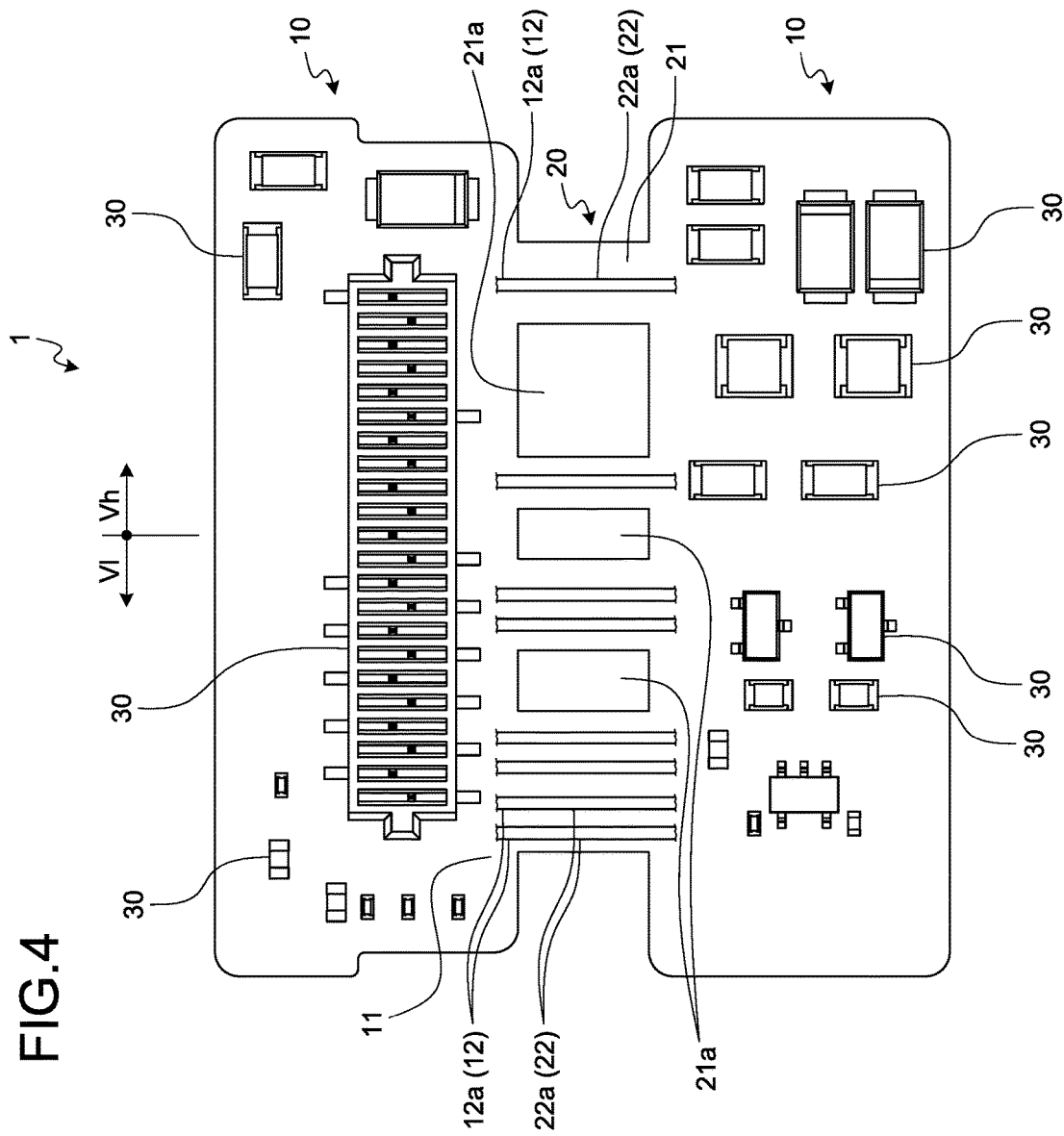
FIG. 4 is a rear view illustrating the electronic circuit board of the embodiment.

The rigid board portion 10 has an insulating insulator 11 and a conductive circuit pattern 12 arranged in layers (FIG. 4).

The insulator 11 is made of an insulating material. The insulator 11 in this example is further divided into a plurality of layers. For example, the insulator 11 includes one hard core layer and a plurality of prepreg layers that is softer than the core layer although not illustrated. The core layer is formed of an insulating material, for example, an epoxy resin, a glass epoxy resin, a paper epoxy resin, ceramics, or the like. On the other hand, the prepreg layer is formed by uniformly impregnating a thermosetting resin (such as epoxy mixed with an additive such as a curing agent) into a fibrous reinforcing material (such as glass cloth and a carbon fiber), and then, turning the resultant into a semi-cured state by heating or drying. Therefore, the prepreg layer is softer than the core layer and has flexibility.

The circuit pattern 12 is formed using a conductive material, for example, by etching processing or the like. The circuit pattern 12 in this example is formed using a copper foil (particularly, a rolled copper foil having better flexibility than an electrolytic copper foil). The circuit pattern 12 is obtained by stretching a plurality of conductive portions 12a (FIG. 4), and the electronic components 30 corresponding to the conductive portions 12a, respectively, are electrically connected thereto. Incidentally, the circuit pattern 12 in this drawing illustrates only some of the conductive portions 12a for convenience of illustration.

In the rigid board portion 10, for example, the circuit pattern 12 is arranged on each plane of the core layer, and the prepreg layer on the inner layer side is stacked on both the planes so as to cover the circuit pattern 12 and a plane of the core layer where the circuit pattern 12 is not arranged. Further, in the rigid board portion 10, another circuit patterns 12 is arranged on each of planes opposite to the core layer side of the prepreg layer on the inner layer side, and another prepreg layer on the outer layer side is stacked on both the planes so as to cover the circuit pattern 12 and a plane of the prepreg layer where the circuit pattern 12 is not arranged. In addition, in the rigid board portion 10, still another circuit pattern 12 is further arranged on each of planes opposite to the core layer side of the prepreg layer on the outer layer side. In this manner, the rigid board portion 10 has a multilayer structure formed of the insulator 11 including the plurality of layers (the core layer and the prepreg layers) and the plurality of circuit patterns 12 divided for each layer. In the rigid board portion 10, the electronic components 30 corresponding to the respective circuit patterns 12 are electrically connected to the circuit patterns 12 as the plurality of electronic components 30 are mounted on both the planes thereof.

Here, the electronic components 30 in this example are mounted on each plane of the rigid board portion 10. The electronic component 30 referred to herein indicates, for example, a circuit protection part such as a relay and a fuse, a capacitor, a resistor, a transistor, an intelligent power switch (IPS), a connector, a terminal fitting, an electronic control unit (so-called electronic control unit (ECU)), various sensor elements, a light emitting diode (LED) element, a speaker, and the like.

The flexible board portion 20 has an insulating insulator 21 and a conductive circuit pattern 22 arranged in layers (FIG. 4).

The insulator 21 is softer than the insulator 11 of the rigid board portion 10 and has flexibility. Accordingly, the insulator 21 is formed using an insulating material which is softer than the insulator 11 of the rigid board portion 10.

The circuit pattern 22 is formed using a conductive material, for example, by etching processing or the like. The circuit pattern 22 in this example is formed using a copper foil (particularly, a rolled copper foil having better flexibility than an electrolytic copper foil). In the circuit pattern 22, a plurality of conductive portions 22a are stretched (FIG. 4). The circuit pattern 22 in this example is electrically connected to each of the circuit patterns 12 on at least two of the plurality of rigid board portions 10. In the circuit pattern 22, the respective conductive portions 22a are electrically connected to the conductive portions 12a of the respective circuit patterns 12 of the two rigid board portions 10. That is, the circuit pattern 22 in this example serves as a connection conductor that electrically connects the circuit pattern 12 of one rigid board portion 10 with the circuit pattern 12 of the other rigid board portion 10.

Since the circuit pattern 22 is formed using the rolled copper foil excellent in flexibility in the flexible board portion 20, the flexibility increases as a ratio of the circuit pattern 22 to the total area as viewed in a stacking direction (that is, as a ratio of the copper foil increases). In other words, the flexibility increases as a ratio of the insulator 21 to the total area as viewed in the stacking direction decreases in the flexible board portion 20.

Figure 3:
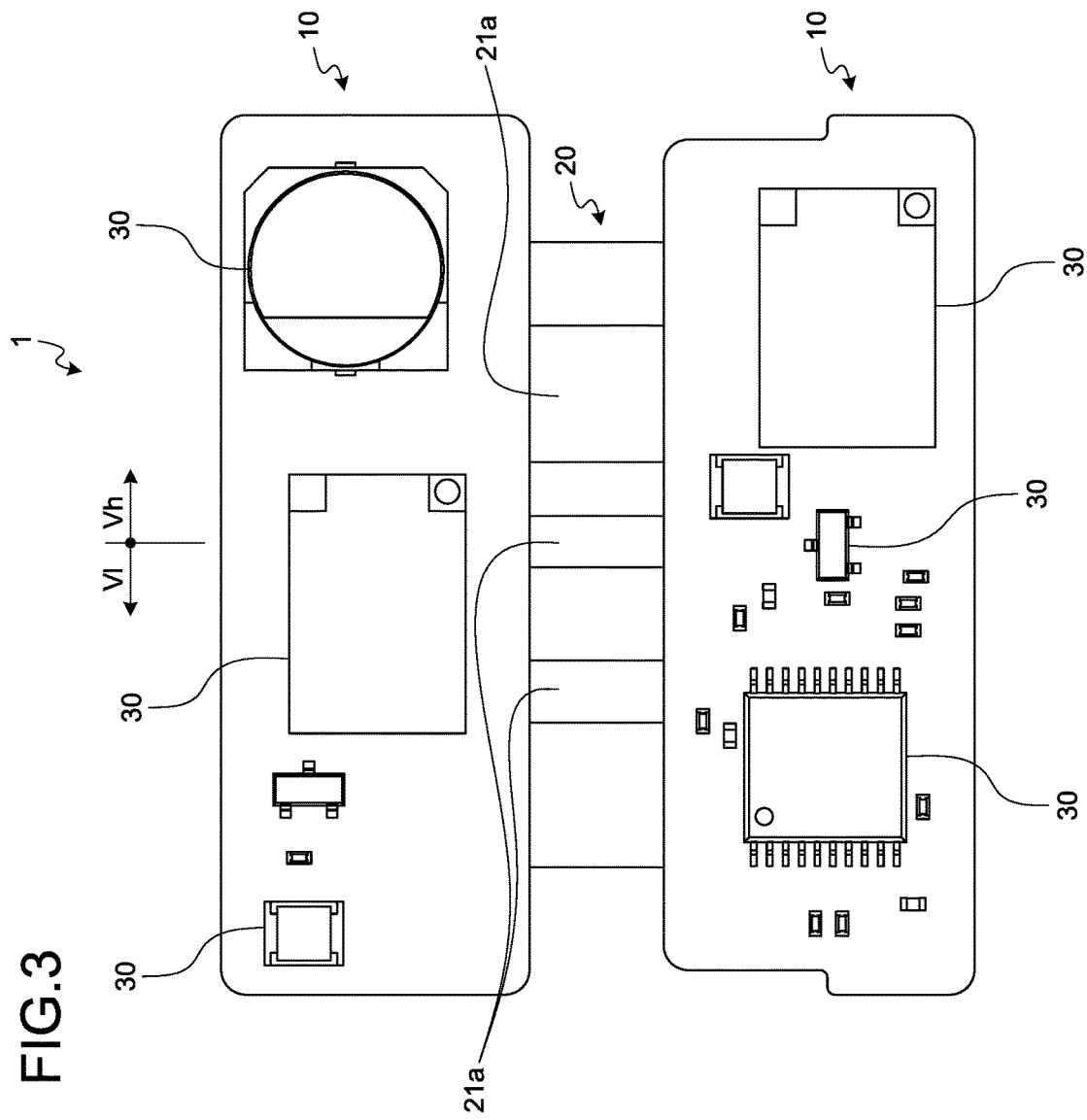
FIG. 3 is a front view illustrating the electronic circuit board of the embodiment.

The electronic circuit board 1 of the present embodiment is roughly divided into a high-voltage circuit region Vh in which a high-voltage circuit is formed and a low-voltage circuit region Vl in which a low-voltage circuit lower than the high-voltage circuit is formed (FIGS. 3 and 4). Here, each of the rigid board portion 10 and the flexible board portion 20 is divided into the high-voltage circuit region Vh and the low-voltage circuit region Vl. In the electronic circuit board 1, the respective rigid board portion 10 and flexible board portion 20 in the high-voltage circuit region Vh are electrically connected to each other, and the respective rigid board portion 10 and flexible board portion 20 in the low-voltage circuit region Vl are electrically connected to each other.

Here, in order to secure an insulating property between the conductive portions 12a of the circuit pattern 12 and between the conductive portions 22a of the circuit pattern 22 on the same layer, it is desirable to set a distance (creepage distance) therebetween to be larger in the high-voltage circuit region Vh than in the low-voltage circuit region Vl. Accordingly, the creepage distance between the conductive portions 22a in the high-voltage circuit region Vh is set to be larger than the creepage distance between the conductive portions 22a in the low-voltage circuit region Vl in the flexible board portion 20. That is, the copper foil ratio in the high-voltage circuit region Vh is lower than that in the low-voltage circuit region Vl in this flexible board portion 20. In addition, it is also desirable to increase a creepage distance between the conductive portion 22a in the high-voltage circuit region Vh and the conductive portion 22a om the low-voltage circuit region Vl so as to secure the insulating property in the flexible board portion 20. Therefore, the flexible board portion 20 has the low copper foil ratio due to formation of the high-voltage circuit.

Further, even in the low-voltage circuit region Vl, the flexible board portion 20 has a possibility that a gap between the conductive portions 22a becomes large depending on the number of the conductive portions 22a (that is, the number of circuits). In this case, the flexible board portion 20 causes a further decrease in the copper foil ratio.

In this manner, the copper foil ratio decreases in the flexible board portion 20 as the distance between the conductive portions 22a of the circuit pattern 22 needs to be set to be large. Accordingly, a ratio of the insulator 21 to the total area as viewed in the stacking direction increases in the flexible board portion 20 as the distance between the conductive portions 22a of the circuit pattern 22 needs to be set to be large. Accordingly, it is difficult to enhance the flexibility in the flexible board portion 20 as the distance between the conductive portions 22a of the circuit pattern 22 needs to be set to be large.

Therefore, a through-hole 21a is formed in the insulator 21 of the flexible board portion 20 at a place where the circuit pattern 22 is not stacked (that is, a place where the circuit pattern 22 is not arranged as viewed in the stacking direction) in the present embodiment (FIGS. 1 to 4).

It is desirable to form the through-hole 21a as large as possible within a range that can secure the insulating property with the peripheral conductive portion 22a. Here, the rectangular through-holes 21a are provided at a plurality of locations. As a result, the copper foil ratio is increased in the flexible board portion 20, and the ratio of the insulator 21 to the total area as viewed in the stacking direction decreases. Accordingly, the electronic circuit board 1 of the present embodiment can enhance the flexibility of the flexible board portion 20 while securing the distance (creepage distance or the like) between the conductive portions 22a of the circuit pattern 22.

Specifically, the flexible board portion 20 in this example is divided into the high-voltage circuit region Vh and the low-voltage circuit region Vl. Accordingly, the through-hole 21a is formed at least in a place where the circuit pattern 22 of the insulator 21 in the high-voltage circuit region Vh of the flexible board portion 20 is not stacked. As a result, the electronic circuit board 1 can enhance the flexibility in the high-voltage circuit region Vh of the flexible board portion 20 while securing the creepage distance between the conductive portions 22a of the circuit pattern 22 of the high-voltage circuit region Vh. Further, in this example, the through-hole 21a is also formed at a place where the circuit pattern 22 of the insulator 21 in the low-voltage circuit region Vl of the flexible board portion 20 is not stacked. For example, the low-voltage circuit region Vl has a size that enables formation of the through-hole 21a, and the through-hole 21a is formed only in a place where the insulating property with the peripheral conductive portion 22a can be secured even if the through-hole 21a is formed. As a result, the electronic circuit board 1 can also enhance the flexibility in the low-voltage circuit region Vl of the flexible board portion 20, and thus, it is possible to make the entire flexible board portion 20 flexible.

Meanwhile, the rigid board portion 10 and the flexible board portion 20 are integrated in the electronic circuit board 1. For example, the rigid board portion 10 and the flexible board portion 20 integrate the circuit patterns 12 and 22 which are electrically connected to each other. Any method may be used for the integration. For example, in the electronic circuit board 1, the rigid board portion 10 and the flexible board portion 20 may be formed as separate parts, and these parts may be assembled and integrated with each other by connection using a connector, welding (including welding between the circuit patterns 12 and 22), screwing, or the like.

Figure 5:
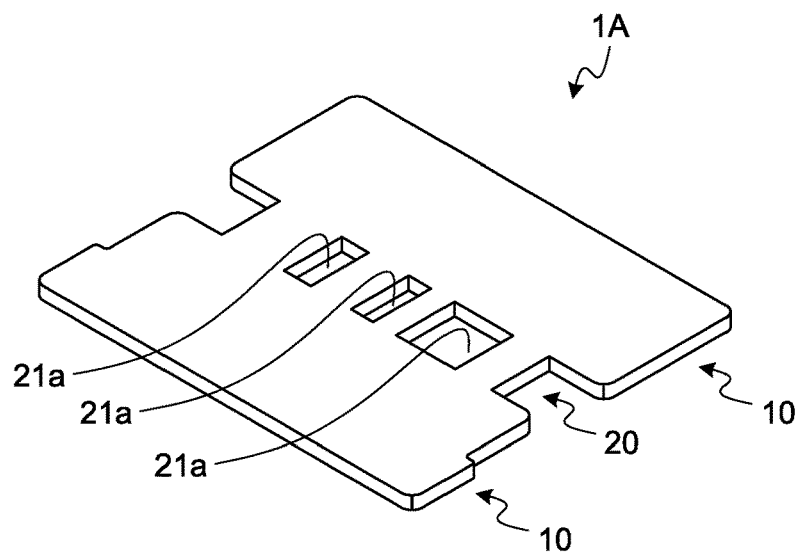
FIG. 5 is a perspective view for describing a circuit board intermediate body.
Figure 5:
Figure 5:
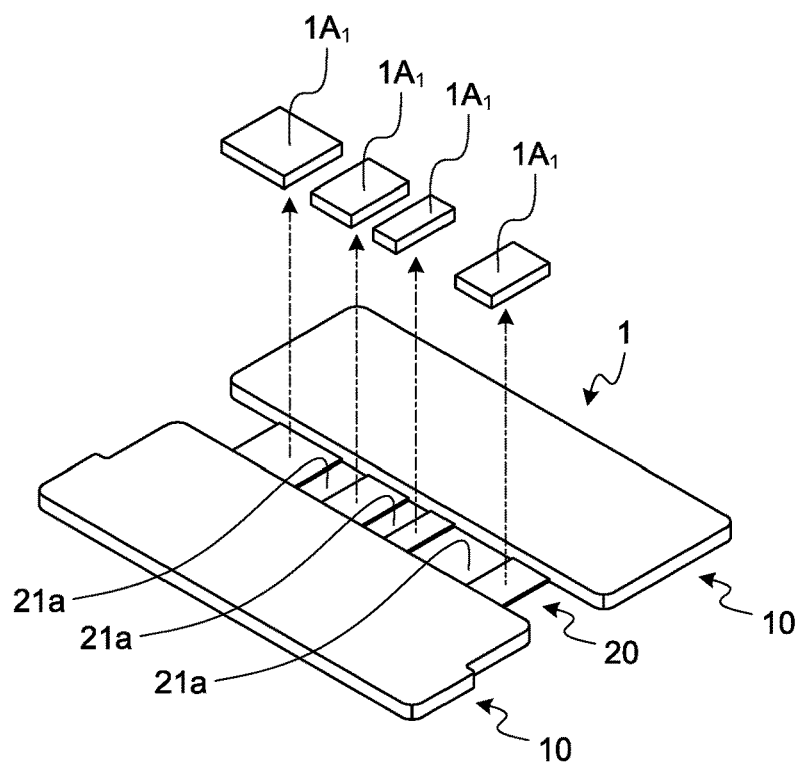

The rigid board portion 10 and the flexible board portion 20 in this example are integrated with each other by being formed on the basis of a circuit board intermediate body 1A including an insulating base material on which a hard insulating layer and an insulating layer softer than the hard insulating layer are stacked and a flexible conductive base material provided on the insulating base material (FIG. 5). In the drawing, the circuit patterns 12 and 22, through-holes, and the like are not illustrated.

The insulating base material is a part to serve as bases of the insulator 11 of the rigid board portion 10 and the insulator 21 of the flexible board portion 20. The insulating base material includes one hard insulating layer and a plurality of soft insulating layers. Each of the insulators 11 of the two rigid board portions 10 is formed of one hard insulating layer and a plurality of soft insulating layers. The insulator 21 of the flexible board portion 20 is formed of one soft insulating layer. The hard insulating layer is formed as the core layer of each of the insulators 11 in the two rigid board portions 10. On the other hand, the plurality of soft insulating layers is formed, respectively, as the plurality of prepreg layers of each of the insulators 11 in the two rigid board portions 10, and one thereof is formed as the insulator 21 of the flexible board portion 20.

The conductive base material is a part to serve as bases of the circuit pattern 12 of the rigid board portion 10 and the circuit pattern 22 of the flexible board portion 20. In the circuit board intermediate body 1A, the soft conductive base material is formed in a plurality of layers. Each of the plurality of conductive base materials is formed as each of the circuit patterns 12 in each of the two rigid board portions 10, and one thereof is formed as the circuit pattern 22 of the flexible board portion 20.

The circuit board intermediate body 1A is formed as the electronic circuit board 1 by cutting a cut portion $1A_1$ so as to leave a soft insulating layer forming the flexible board portion 20 and a conductive base material provided on this insulating layer (FIG. 5). The cut portion $1A_1$ includes a hard insulating layer, a soft insulating layer, and a conductive base material which do not serve as constituent elements of the flexible board portion 20. That is, the flexible board portion 20 is formed using a remaining portion, which has been cut from the circuit board intermediate body 1A to leave a soft insulating layer and a conductive base material provided on the insulating layer to form the flexible board portion 20.

Here, the through-hole 21a may be formed in advance in the state of the circuit board intermediate body 1A, or may be formed after the cut portion $1A_1$ is removed. In the former case, one cut portion $1A_1$ having a rectangular outer shape with the rectangular through-hole 21a formed therein or a plurality of the rectangular cut portions $1A_1$ is removed from the circuit board intermediate body 1A formed in a substantially rectangular shape. In the latter case, the single rectangular cut portion 1A₁ is removed from the circuit board intermediate body 1A formed in a substantially rectangular shape. The example of FIG. 5 illustrates the former case where the plurality of rectangular cut portions 1A₁ is removed. In the electronic circuit board 1 formed in this manner, the rectangular flexible board portion 20 is arranged in the state of being integrated between the two substantially-rectangular rigid board portions 10, and the flexible board portion 20 is provided with the rectangular through-hole 21a.

Figure 6:
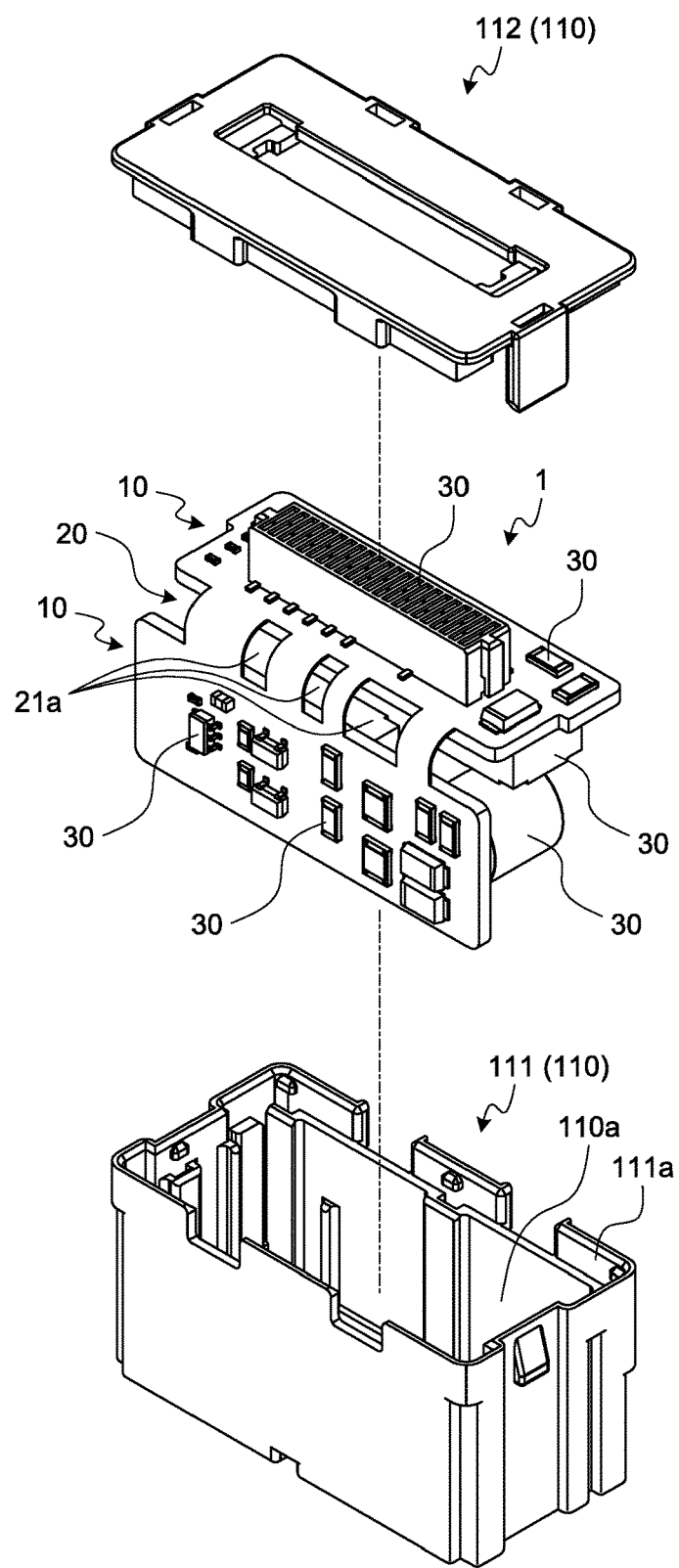
FIG. 6 is an exploded perspective view of an electronic component unit formed of an electronic circuit board and an accommodation box.
Figure 7:
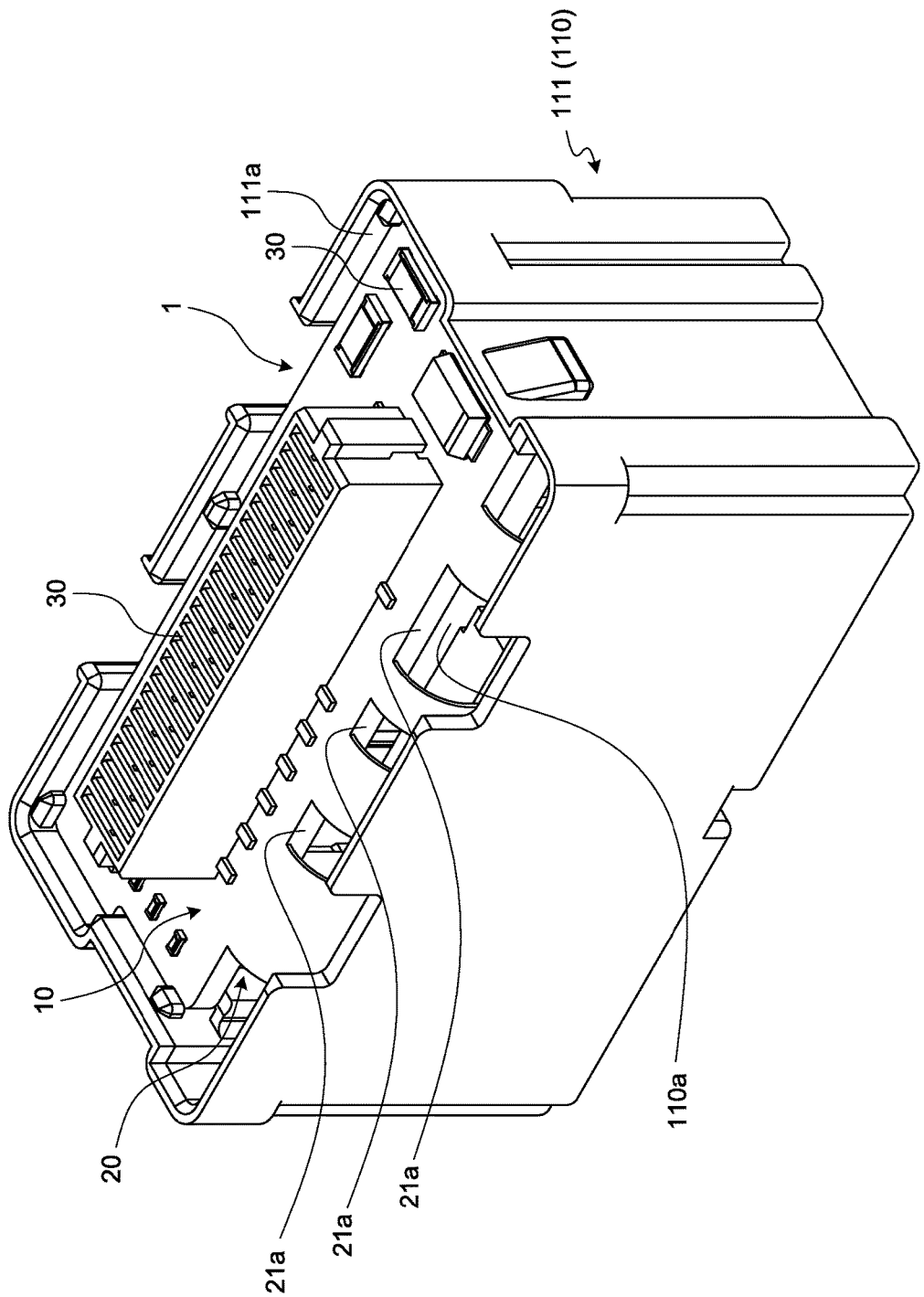
FIG. 7 is a perspective view illustrating an accommodating state of the electronic circuit board in an accommodation chamber, and illustrates a state before injection of a filler.
Figure 8:
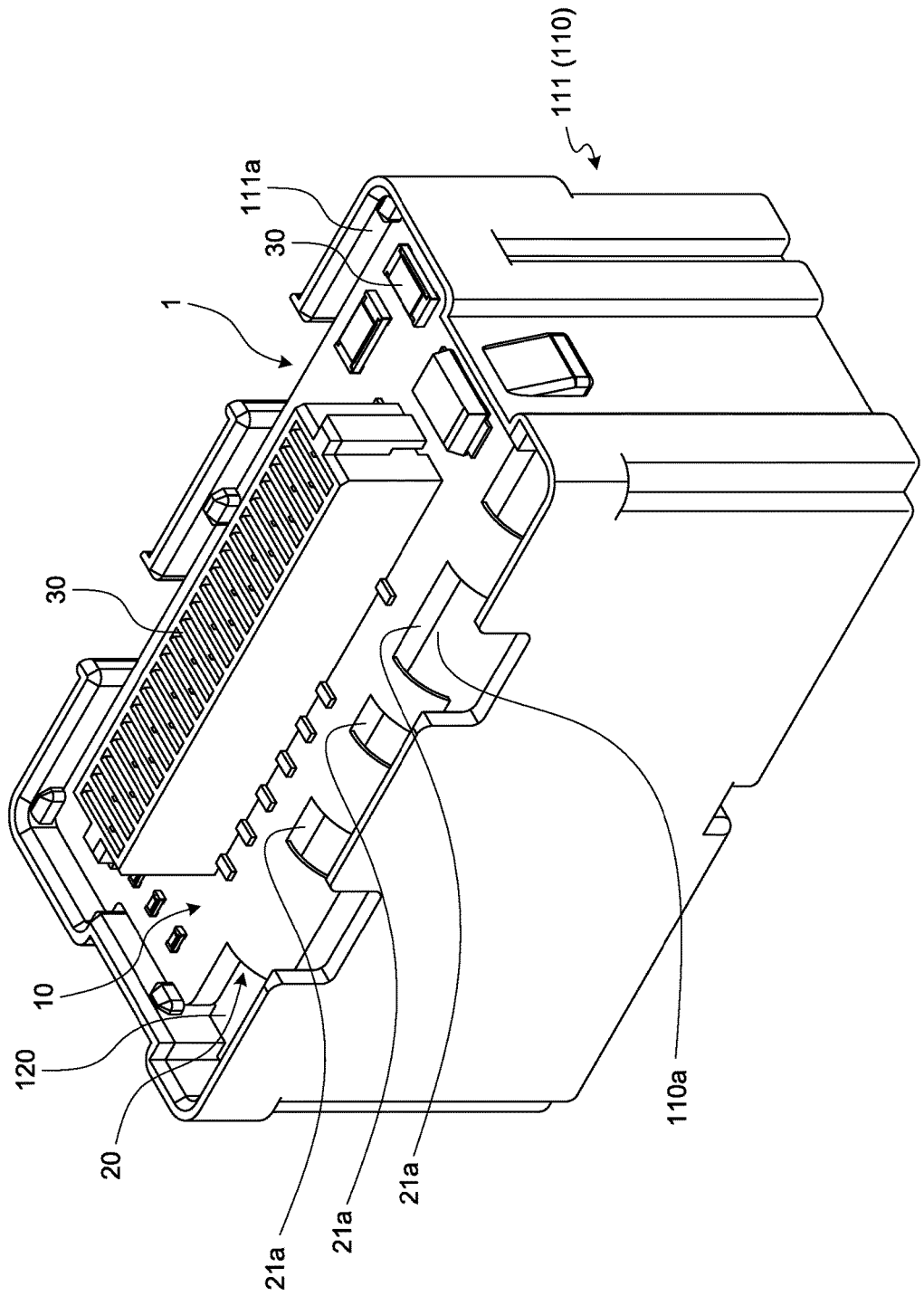
FIG. 8 is a perspective view illustrating the accommodating state of the electronic circuit board in the accommodation chamber, and illustrates a state after injection of the filler.

The electronic circuit board 1 of the present embodiment is bent in an L-shape with the flexible board portion 20 as a boundary and is accommodated in an accommodation chamber 110a of an accommodation box 110 in the bent state (FIGS. 6 to 8).

The accommodation box 110 includes an accommodating member 111 and a cover member 112 (FIG. 6). The accommodating member 111 is a member to serve as the main body in which the accommodation chamber 110a is formed. The accommodating member 111 in this example is formed in a square tubular shape closed at one end, and an inner space thereof is used as the accommodation chamber 110a. A rectangular opening 111a communicating with the accommodation chamber 110a is formed in the accommodating member 111 (FIGS. 6 to 8). The electronic circuit board 1 is accommodated in the accommodation chamber 110a from the opening 111a thereof. The cover member 112 is a member that closes the opening 111a of the accommodation chamber 110a. The cover member 112 is formed in a rectangular shape, and is fixed to the accommodating member 111 in the state of closing the opening 111a.

Figure 9:
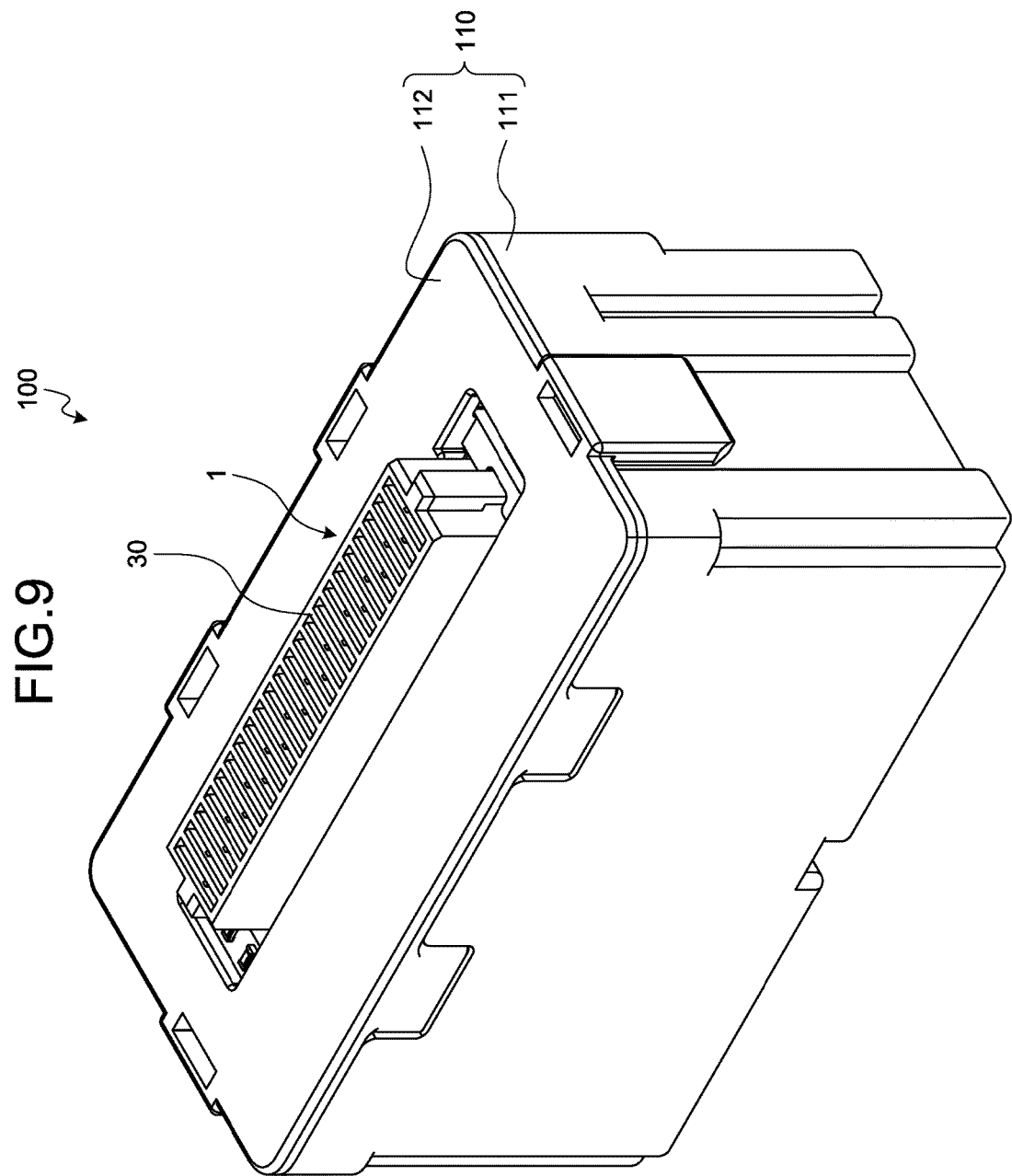
FIG. 9 is a perspective view illustrating the electronic component unit.

Here, the electronic circuit board 1 in the state of being accommodated in the accommodation box 110 is referred to as an electronic component unit 100 (FIG. 9). In the electronic component unit 100, a sealing body 120 is formed in the accommodation chamber 110a by filling the accommodation chamber 110a accommodating the electronic circuit board 1 with a filler in order to secure an insulating property, moisture-proofness, strength, and the like of the electronic circuit board 1 (FIG. 8). As the filler, for example, it is desirable to use a material such as a thermosetting resin that can be cured after filling. The electronic circuit board 1 (the rigid board portion 10 and the flexible board portion 20) is accommodated in the accommodation chamber 110a such that the through-hole 21a faces the opening 111a (FIG. 7). In this case, the through-hole 21a can be used as an injection port of the filler with which the accommodation chamber 110a is filled. Accordingly, it is unnecessary to provide the injection port dedicated for filling of the filler therein or in the accommodation box 110 in the electronic circuit board 1 of the present embodiment, and thus, it is possible to reduce a size and a space of the electronic component unit 100.

As described above, the electronic circuit board 1 of the present embodiment can enhance the flexibility of the flexible board portion 20 while securing the distance (creepage distance or the like) between the conductive portions 22a in the circuit pattern 22 of the flexible board portion 20 by providing the through-hole 21a in the flexible board portion 20. Therefore, it is easy to bend a portion between the two rigid board portions 10 via the flexible board portion 20 in the electronic circuit board 1, and it is possible to suppress deterioration in durability accompanying the bending. Further, since the through-hole 21a of the flexible board portion 20 can be used as the injection port of the filler in the electronic circuit board 1 of the present embodiment, it is possible to reduce the size and the space of the electronic component unit 100.

The electronic circuit board according to the present embodiment can enhance the flexibility of the flexible board portion while securing a distance (creepage distance or the like) between conductive portions in a circuit pattern of the flexible board portion by providing a through-hole in the flexible board portion. Therefore, it is easy to bend a portion between the two rigid board portions via the flexible board portion in the electronic circuit board, and it is possible to suppress deterioration in durability accompanying the bending.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. An electronic circuit board comprising:
  a plurality of hard rigid board portions, the plurality of hard rigid board portions including at least two hard rigid board portions, each of the plurality of hard rigid board portions including an insulator and a conductive circuit pattern and which electrically connects a mounted electronic component to the conductive circuit pattern; and
  at least one soft flexible board portion including an insulator and a conductive circuit pattern electrically connected to each of the conductive circuit patterns of the at least two hard rigid board portions among the plurality of hard rigid board portions, the at least one soft flexible board portion being integrated with the at least two hard rigid board portions, wherein
  the insulator of the at least one soft flexible board portion includes a through-hole positioned where the conductive circuit pattern of the at least one flexible board portion is not stacked, and
  wherein the at least one soft flexible portion is more flexible than each of the plurality of hard rigid board portions.
2. The electronic circuit board according to claim 1, wherein
  the plurality of hard rigid board portions and the at least one flexible board portion are formed on a circuit board intermediate body, the circuit board intermediate body including an insulating base on which a hard insulating layer and a soft insulating layer are stacked and a soft conductive base provided on the insulating base,
  the at least one flexible board portion being formed using a remaining portion cut from the circuit board intermediate body so as to leave a portion of the soft insulating layer and a portion of the soft conductive base provided on the soft insulating layer so as to form the at least one flexible board portion,
  each of the insulators of the plurality of hard rigid board portions formed using the hard insulating layer and the soft insulating layer,
  each of the conductive circuit patterns of each of the plurality of hard rigid board portions and the conductive circuit pattern of the at least one flexible board portion formed using the conductive base, and
  the insulator of the at least one flexible board portion being formed using the soft insulating layer.

3. The electronic circuit board according to claim 2, wherein
the conductive circuit pattern of the at least one flexible board portion being formed using a rolled copper foil.

4. The electronic circuit board according to claim 3, wherein
when each of the plurality of hard rigid board portions and the at least one flexible board portion are accommodated in an accommodation chamber of an accommodation box, such that the through-hole faces an opening of the accommodation chamber, the through-hole is configured to be used as an injection port of a filler with which the accommodation chamber is filled.

5. The electronic circuit board according to claim 2, wherein
when each of the plurality of hard rigid board portions and the at least one flexible board portion are accommodated in an accommodation chamber of an accommodation box, such that the through-hole faces an opening of the accommodation chamber, the through-hole is configured to be used as an injection port of a filler with which the accommodation chamber is filled.

6. The electronic circuit board according to claim 1, wherein
the conductive circuit pattern of the at least one flexible board portion being formed using a rolled copper foil.

7. The electronic circuit board according to claim 6, wherein
when each of the plurality of hard rigid board portions and the at least one flexible board portion are accommodated in an accommodation chamber of an accommodation box, such that the through-hole faces an opening of the accommodation chamber, the through-hole is configured to be used as an injection port of a filler with which the accommodation chamber is filled.

8. The electronic circuit board according to claim 1, wherein
when each of the plurality of hard rigid board portions and the at least one flexible board portion are accommodated in an accommodation chamber of an accommodation box, such that the through-hole faces an opening of the accommodation chamber, the through-hole is configured to be used as an injection port of a filler with which the accommodation chamber is filled.

* * * * *